United States Patent
Franca-Neto et al.

(10) Patent No.: US 9,472,281 B1
(45) Date of Patent: Oct. 18, 2016

(54) NON-VOLATILE MEMORY WITH ADJUSTABLE CELL BIT SHAPE

(71) Applicant: HGST Netherlands B.V., Amsterdam (NL)

(72) Inventors: Luiz M. Franca-Neto, Sunnyvale, CA (US); Kurt Allan Rubin, San Jose, CA (US)

(73) Assignee: HGST NETHERLANDS B.V., Amsterdam (NL)

( * ) Notice: Subject to any disclaimer, the term of this patent is extended or adjusted under 35 U.S.C. 154(b) by 0 days.

(21) Appl. No.: 14/788,167

(22) Filed: Jun. 30, 2015

(51) Int. Cl.
G11C 11/00 (2006.01)
G11C 11/34 (2006.01)
G11C 13/00 (2006.01)
G11C 11/56 (2006.01)

(52) U.S. Cl.
CPC ....... G11C 13/0069 (2013.01); G11C 11/5678 (2013.01)

(58) Field of Classification Search
CPC .......... G11C 13/0035; G11C 11/5642; G11C 11/5628; G11C 11/5678; G11C 13/004; G11C 16/26; G11C 16/349; G11C 2013/0054
See application file for complete search history.

(56) References Cited

U.S. PATENT DOCUMENTS

| 6,838,692 | B1 | 1/2005 | Lung | |
|---|---|---|---|---|
| 8,558,213 | B2 | 10/2013 | Goux | |
| 8,659,929 | B2 | 2/2014 | Kumar | |
| 8,687,432 | B2 | 4/2014 | Hou et al. | |
| 2005/0128799 | A1* | 6/2005 | Kurotsuchi | G11C 11/56 365/163 |
| 2008/0149912 | A1* | 6/2008 | Nakai | G11C 11/005 257/5 |
| 2010/0214847 | A1* | 8/2010 | Nishihara | G11C 16/0483 365/185.18 |
| 2012/0166707 | A1* | 6/2012 | Franca-Neto | G06F 11/1048 711/103 |
| 2013/0306929 | A1 | 11/2013 | Lee et al. | |
| 2014/0071746 | A1 | 3/2014 | Jurasek et al. | |
| 2014/0185358 | A1 | 7/2014 | Jo et al. | |

FOREIGN PATENT DOCUMENTS

WO 2009102918 A1 8/2009

OTHER PUBLICATIONS

Davdi Cabrera, Material Engineering for Phase Change Memory, RIT Scholar Works, Rochester Institute of Technology, Jun. 20, 2014 <http://scholarworks.rit. edu/cgi/viewcontent. cgi?article=9037&context=theses>.
H. Pozidis, et al, Enabling Technologies for Multilevel Phase-Change Memory, IBM Research—Zurich, CH-8803 Ruschlikon, Switzerland <http://www.epcos.org/library/papers/pdf_2011/Oral-Papers/S7-03.pdf>.

(Continued)

Primary Examiner — Hien Nguyen
(74) Attorney, Agent, or Firm — Patterson & Sheridan, LLP

(57) ABSTRACT

Embodiments of the present disclosure generally relate to non-volatile memory and, in particular, non-volatile memory with adjustable cell bit shapes. In one embodiment, an adjustable memory cell is provided. The memory cell generally includes a gate electrode, at least one recording layer and a channel layer. The channel layer generally is capable of supporting a depletion region and is disposed between the gate electrode and the at least one recording layer. In this embodiment, upon activating the gate, the channel layer may be depleted and current initially flowing through the channel may be steered through the at least one recording layer.

20 Claims, 14 Drawing Sheets

(56) References Cited

OTHER PUBLICATIONS

Y.Sasago, et al; Phase-Change Memory Driven by Poly-Si MOS Transistor with Low Cost and High-Programming Gigabyte-Per-Second Throughput; 2011 Symposium on VLSIO Technology Digest of Technical Papers p. 96-97.

M. Kinoshita, et al; Scalable 3-D Vertical Chain-Cell-Type Phase-Change Memory with 4F2 Poly-Si Diodes; 2012 Syjmposium on VLSI Technology Digest of Technical Papers p. 35-36.

Kazuaki Yoshioka, High Density NAND Phase Change Memory with Block-Erase Architecture to Compromise Write and Distrub Requirments; Graduate School of Engineering, University of Tokyo, Tokyo, Japan 2012.

* cited by examiner

NARROW - WIDTH BIT

MEDIUM-DEPTH BIT

FULL-DEPTH BIT

NON-VOLATILE MEMORY WITH ADJUSTABLE CELL BIT SHAPE

BACKGROUND

1. Field of the Disclosure

Embodiments of the present disclosure generally relate to non-volatile memory, and more specifically, embodiments disclosed herein relate to storing multiple bits in a non-volatile memory cell and adjusting the size and/or shape of the multiple bits.

2. Description of the Related Art

A number of different memory technologies exist today for storing information for use in computing systems. These different memory technologies may, in general, be split into two major categories, volatile memory and non-volatile memory. Volatile memory may generally refer to types of computer memory that requires power in order to retain stored data. Non-volatile memory, on the other hand, may generally refer to types of computer memory that do not require power in order to retain stored data. Examples of types of volatile memory include certain types of random access memory (RAM), such as dynamic RAM (DRAM) and static RAM (SRAM). Examples of types of non-volatile memory include read-only memory (ROM), flash memory, such as NOR and NAND flash, etc.

In recent years, there has been a demand for higher density (capacity) devices, which have relatively low cost per bit, for use in high capacity storage applications. Today, the memory technologies that generally dominate the computing industry are DRAM and NAND flash; however, these memory technologies may not be able to address the current and future capacity demands of next generation computing systems.

Recently, a number of emerging technologies have drawn increasing attention as potential contenders for the next generation memory type. Some of these emerging technologies include phase change memory (PCM), resistive RAM (known by both the acronym ReRAM or RRAM) and others. For the sake of convenience, resistive RAM may be referred to as ReRAM throughout the present disclosure.

PCM is a type of non-volatile memory technology that functions based upon switching a memory cell, typically based on chalcogenides such as $Ge_2Sb_2Te_5$, between two stable states, a crystalline state and an amorphous state. Switching between the two states may be enabled by heating the memory cell, which is typically done by applying an electrical current through the PCM cell. ReRAM, which shares some similarities to PCM in that they both operate via mechanisms that have state-dependent resistance, is also a type of non-volatile memory technology that generally stores data using changes in electrical resistance.

Each of these different emerging memory technologies may be serious contenders to dislodge NOR and NAND flash memory in solid state storage applications and, in the case of NAND flash, solid-state drives (SSDs). As such, it may be desirable to provide techniques that may be used to achieve higher capacity in non-volatile memory while minimizing cost per bit.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include, among others, adjusting/controlling the size and/or shape of bit(s) stored in a non-volatile memory cell.

Aspects of the present disclosure generally relate to non-volatile memory, and more particular, to non-volatile memory with adjustable cell-bit shapes.

One embodiment of the present disclosure provides an adjustable non-volatile memory cell. The memory cell generally includes a gate, at least one recording layer and a channel layer. The channel layer is generally disposed between the gate and the at least one recording layer. Additionally, the channel layer may be capable of supporting a depletion region and a current may initially be flowing through the channel. Upon activating the gate, the channel layer may be depleted and the current initially flowing through the channel may be steered (or deflected) through the at least one recording layer. Further, a portion of the at least one recording layer is capable of being transformed from a first resistance state to a second resistance state, based on the current steered through the at least one recording layer, and at least one of a size or shape of the transformed portion is capable of being controlled in order to store at least one bit.

Another embodiment of the present disclosure provides a method for recording one or more bits in at least one memory cell. The method may generally include applying a current to a channel layer of the memory cell, and activating a gate of the memory cell by applying a voltage to the gate of the memory cell. The method may also include, upon activating the gate, depleting the channel layer in order to channel the current from the channel layer into a recording layer of the memory cell, wherein the recording layer is in a first resistance state. The method may further include transforming at least one portion of the recording layer from the first resistance state to a second resistance state in order to write one or more bits into the recording layer, wherein the first resistance state and the second resistance state are different, and wherein at least one of a size or shape of the at least one transformed portion of the recording layer is controlled, in part, by the voltage applied to the gate and the current applied into the channel layer.

Still another embodiment of the present disclosure provides a system. The system may generally include a plurality of memory cells and a processor configured to address each of the plurality of memory cells. For example, for each of the plurality of memory cells, the processor may generally be configured to apply a current to a channel layer of the memory cell and activate a gate of the memory cell by applying a voltage to the gate of the memory cell. The processor generally may also, upon activating the gate, channel the current from the channel layer into a recording layer of the memory cell, wherein the recording layer is in a first resistance state. The processor may further be able to transform at least one portion of the recording layer from a first resistance state to a second resistance state in order to write one or more bits into the recording layer, wherein the first resistance state and the second resistance state are different, and wherein at least one of a size or shape of the at least one transformed portion of the recording layer is controlled, in part, by the voltage applied to the gate and the current applied into the channel layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this invention and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

According to various aspects of the present disclosure, the techniques, apparatus, systems, etc., described herein may generally be used to store multiple bits in a memory cell(s), for example, based on a sequence of voltage (and current) profiles of controlled amplitude and temporal width that are applied to the memory cell(s). Additionally, the techniques described herein may generally be used to control the size and/or shape of a region of a recording material (e.g., phase change material, ReRAM material, etc.) that is transformed from one state to another and has state-dependent resistance. For example, as will be described in more detail below, the size of a transformed region may be controlled, in part, by using a gate (of a memory cell) to control the position where current flows into and out of the recording layer.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects. It should be noted that the figures discussed herein may not be drawn to scale and may not indicate actual or relative sizes.

Figure 1:
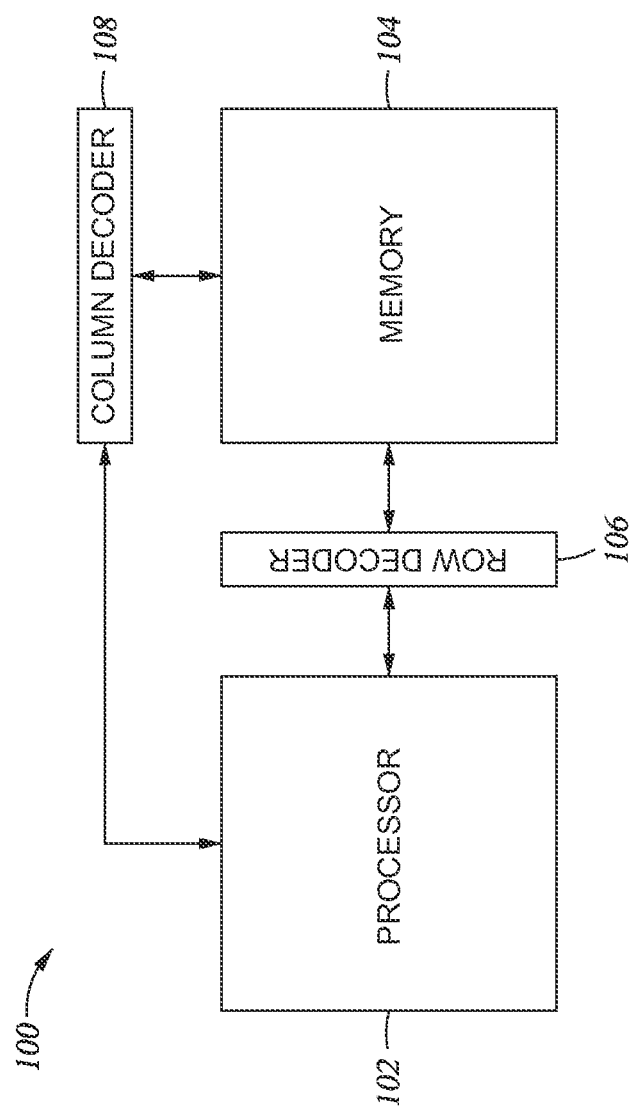
FIG. 1 illustrates a block diagram of an example processing system, in accordance with embodiments of the present disclosure.

FIG. 1 is a block diagram illustrating an example of a processing system 100 in which one or more embodiments of the present disclosure may be utilized and/or practiced. For example, as will be described in more detail below, the processing system 100 may incorporate one or more memory cells (e.g., as shown in FIGS. 2, 6, 8, 10-11, etc.) and may be configured to store one or more bits (e.g., as shown in FIGS. 4A-4C, 5A-5C, etc.) in each of the one or more memory cells utilizing the techniques presented herein.

Figure 6:
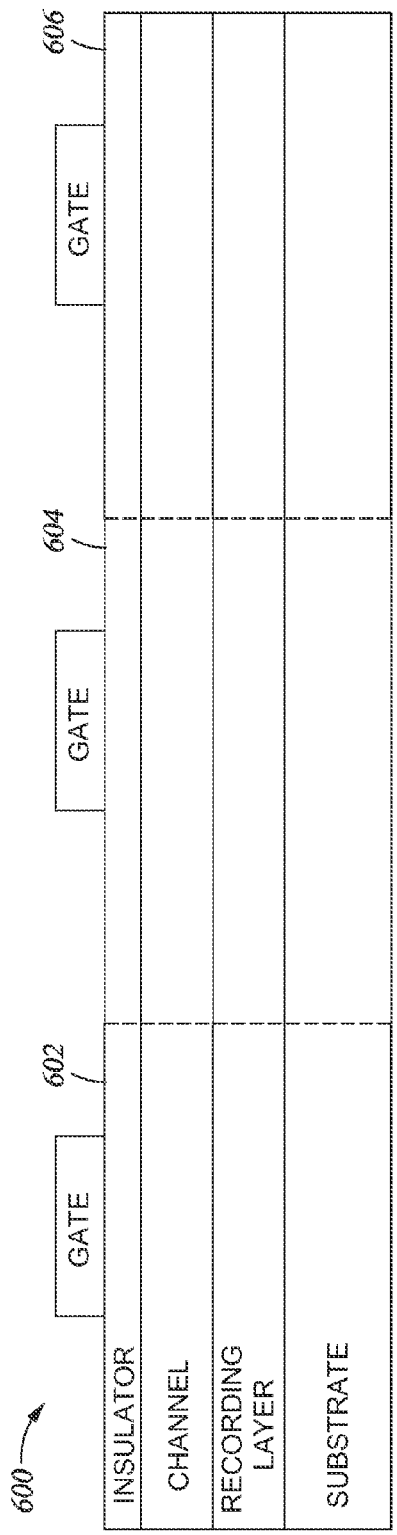
FIG. 6 illustrates an example architecture of a string of memory cells, in accordance with embodiments of the present disclosure.

As shown, the processing system 100 may include a processor 102, a storage device (e.g., memory) 104, a row decoder 106, and a column decoder 108. The storage device 104 may include a plurality of memory cells (not shown), which may be arranged in an array formation of rows and columns. The processor 102 may interface with the array of memory cells (in the storage device 104) via the row decoder 106 and column decoder 108. In one example, individual memory cells may be programmed or queried via an arrangement of word lines (WLs) and bit lines (BLs). The WLs may extend along the rows of the array and the BLs may extend along the columns of the array. An individual memory cell may exist at a junction between the WLs and BLs. In another example, a string of memory cells (e.g., as shown in FIGS. 6-7) may also be programmed or queried via the arrangement of WLs and BLs. In general, during a read/write cycle, the row decoder 106 may select (e.g., via a selecting device) a row of memory cells to write to or read from. Similarly, the column decoder 108 may select (e.g., via a selecting device) a column address of memory cells for the read/write cycle. Examples of selecting devices may include transistors (e.g., a type of field-effect transistor (FET), a type of bipolar junction transistor (BJT), etc.), diodes, and the like. Some examples of a transistor may include metal-oxide (MOS) transistors, etc. The transistor can be made from poly-silicon.

According to various embodiments, each one of the memory cells within storage device 104 may include any type of memory cell that has a state-dependent resistance, such that data may be stored in the cell based on the particular state of the memory cell. For example, in some embodiments, each one of the memory cells may include a phase change memory (PCM) cell, a resistive RAM (ReRAM) cell, and the like. According to various embodiments, each one of the memory cells within storage device 104 may include any type of memory cell that is capable of storing data based on the magnetic polarization of storage elements within the cells, e.g., such as magnetic RAM (MRAM), and the like.

Figure 2:
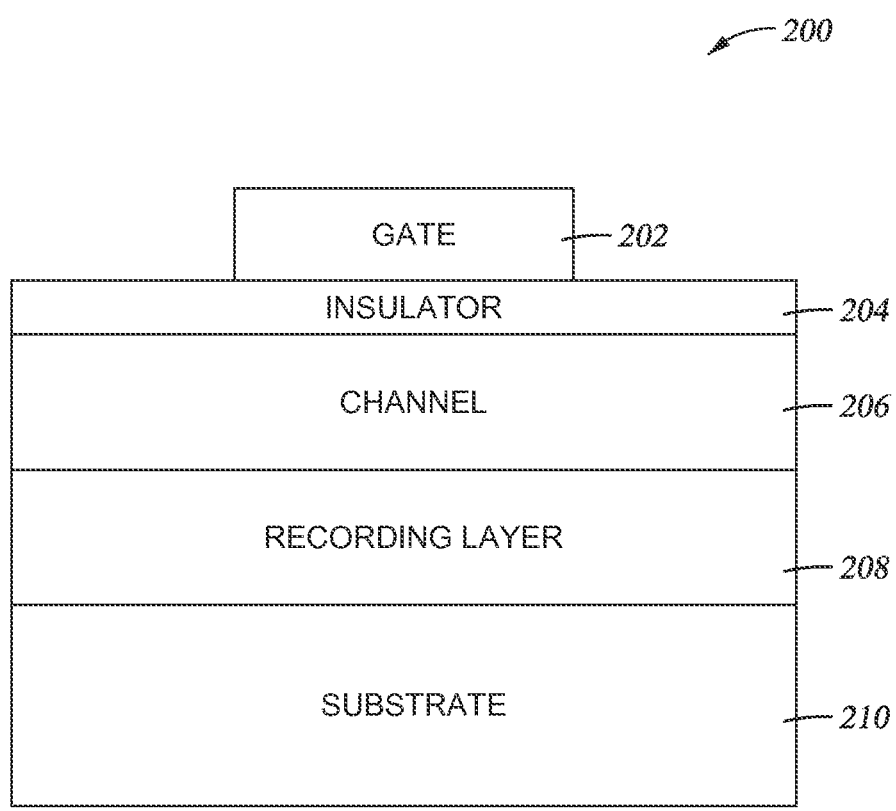
FIG. 2 illustrates an example architecture of a memory cell, in accordance with embodiments of the present disclosure.

FIG. 2 illustrates an architecture of a memory cell 200, according to various embodiments of the present disclosure. The memory cell 200 may be an example of one of a plurality of memory cells within storage device 104. As shown, the memory cell 200 may include a gate electrode 202, an insulator layer 204, a channel layer 206, a recording layer 208, and a substrate layer 210. The substrate layer 210 may be a type of a material with relatively low electrical conductivity compared to the recording layer, including materials such as oxides and nitrides such as SiOx, SiNx, C, AlOx, or other low electrical conductivity material. The substrate layer 210 could also be a material with a melting temperature which is larger than the melting temperature of the recording layer material and serve as a separation layer between two phase change recording layer materials. In general, the material for the substrate layer 210 could be any material on which a recording layer (e.g., recording layer 208) may be deposited on. In an additional embodiment (not shown), the substrate could be a spacer layer that separates two recording layers. For the case of PCM, the spacer layer would be selected from a material with a melting temperature above the melting temperature of PCM. The spacer layer could be made of a material such as TiN or polysilicon. The conductivity of the spacer layer would be chosen to allow a substantial amount of the channel current to pass through the spacer layer, but not short out the other recording layers.

The gate electrode 202 may form part of a selecting device, such as a transistor, diode, or the like, which may be used to address the memory cell 200. For example, if the selecting device is a three terminal selecting device, such as a transistor, the gate electrode 202 of the transistor may be coupled to one of a plurality of WLs, with the drain electrode and source electrode of the transistor connected to BL and to ground, respectively. Further, although not shown, alternatively or additionally, in some embodiments, a gate electrode can also be included below the recording layer.

The channel layer 206 may comprise any type of semiconductor material (e.g., such as polysilicon, or silicon) capable of supporting a depletion region and may be undoped, n-type or p-type. The doping can be provided by an implantation step. In general, when a voltage (or current) is applied to the gate electrode 202, an electrical current may flow (e.g., through the channel layer 206) from the source to drain of the transistor. The amount of electrical current that flows may be function of the voltage (or current) applied to the gate electrode 202. Depending on whether the selecting device (e.g., transistor) is designed as an enhancement mode or depletion mode selecting device, a zero voltage applied to the gate electrode 202 relative to source will allow current flow from source to drain. A depletion mode transistor, for example, may allow current to flow from source to drain (e.g., through the channel 206) with a zero voltage from gate to source, while current flow (through the channel 206) is blocked by changing the gate voltage to some other finite value. The current may then flow from the drain electrode through the recording layer 208 of the memory cell 200. The recording layer can be any material which undergoes a change of resistance when current is passed through the recording layer. This includes the class of phase change and RRAM materials. Phase change materials include TeGeSb of various compositions. RRAM materials include metal oxides such as SiOx, TaOx, TiOx, HfOx, NiOx, NbOx, ScOx, ErOx, YOx, ZrOx and other metal oxides, metal nitrides such as SiNy, TaNy, TiNy, and other metal nitrides as well as composite layers containing one or more layers of an oxide or nitride. The RRAM material can also have more constituents than a binary material. For example it could be a ternary or quaternary composition materials. The recording layer also could contain mobile ion species such as Ag. As will be described in more detail below, in general, the amount of current that is able to flow the recording layer 208 may be controlled, in part, by the amount of voltage (or current) applied to the gate electrode 202.

The insulator layer 204 may separate the gate electrode 202 and channel layer 206, and, in general, may be used to prevent (or reduce) current (channeled through the channel layer 206) from flowing back through the gate electrode 202 (e.g., when the channel layer is depleted). Examples of materials that may be used for the insulator layer 204 include different oxide, nitride or other materials such as silicon oxide, silicon nitride, aluminum oxide hafnium oxide, zirconium oxide, or carbon.

The recording layer 208 may be capable of supporting a number of different non-volatile memory types. For example, the recording layer 208 may be compatible with memory types that have state-dependent resistance, such as different types of PCM, different types of ReRAM, and others. In another example, the recording layer 208 may be compatible with memory types that are capable of supporting one or more magnetic polarization fields (e.g., with one or more magnetic tunnel junction (MTJ) layers), such as MRAM, etc.

According to some embodiments, for PCM, the phase change materials that may be utilized within recording layer 208 may include any of germanium antimony (GeSb), germanium tellurium (GeTe), Sb2Te3, Ge2Te2Te5, or compositions containing germanium antimony tellurium (GeSbTe or GST), and alloys thereof as well as those materials with additions of other materials such as Sn. Other PCM materials include Ga—Sb, Mg—Sb, Al—Sb, Al—Sb—Te, materials containing In, Ga, Te, Ge, Sb, or Bi, and other chalcogenides. Each of these phase change materials, in general, may have one or more different material (electrical and/or thermal) properties, which may offer one or more improvements over conventional non-volatile memory types. For example, the recording layer 208 may include different types of single-phase phase change materials, phase separating alloys, higher viscosity slower crystalline alloys, etc. The single phase alloys may offer fast erase speeds and the phase separating alloys and higher viscosity slower crystalline alloys may have lower melting temperatures and/or longer crystalline times, which may offer higher cyclability.

According to some embodiments, for ReRAM, the materials that may be utilized within recording layer 208 may include any materials that utilize filaments and/or oxygen vacancies to implement resistance switching between different states. According to some embodiments, for ReRAM, the materials that may be utilized within recording layer 208 may include metal oxides such as Hf—O, Ta—O, Ti—O, Ni—O, Nb—O, Sc—O, Er—O, Y—O, Zr—O or other metal oxides. In some embodiments layer 208 may be further subdivided into a set of layers of various thickness and made of various materials including different metal-oxides with different composition or constituents. The metal oxide of layer 208 may include but is not limited to being a binary oxide or a ternary oxide. The layer 208 may also represent one or more layers constituting CBRAM-type materials such as Cu or Ag in Cu-containing matrix.

For clarity, certain aspects of the techniques are described below for PCM, and PCM terminology is used in much of the description below. However, it should be noted that the techniques described below may also be used for other materials that have state-dependent resistance, such as ReRAM, etc.

As mentioned above, in general, storing data in phase change material is achieved by heating the phase change material until the phase change material is reset into a high (amorphous) resistance state or set into a low (crystalline) resistance state. Referring to memory cell 200, for example, as a result of applying a voltage to the gate electrode 202, the current that is deflected into the phase change material in recording layer 208 may generate thermal energy which may cause the phase change material to transition between states. Generally, to transition the phase change material into the amorphous state, a reset pulse of large amplitude (e.g., above the melting temperature of the phase change material) and short duration may be applied to the phase change material in order to melt the phase change material (e.g., into a molten state) and allow the phase change material to rapidly cool such that the phase change material is left in a disordered amorphous state. To transition the phase change material into the crystalline state, a set pulse (of sufficient amplitude to be above the glass transition temperature of the phase change material) may be applied to the phase change material and may be held for a sufficient time to allow the phase change material to crystallize into an ordered resistance state. In some embodiments, the high resistance state may be used to store a '0' data bit and the low resistance state may be used to store a '1' data bit.

In general, one or more techniques described herein may be utilized to achieve a three-dimensional memory in a two dimensional recording medium (e.g., such as recording layer 208). For example, as will be described in more detail below, as opposed to building multiple successive recording layers (as is typically done in conventional recording methods), the techniques presented herein may allow for storing multiple bits in a single layer of recording medium, for example, by applying a sequence of current signals of controlled amplitude and/or temporal width, and controlling (or adjusting) the size and/or shape of a recorded bit region in the recording medium in order to achieve a 3-D volumetric media.

Figure 3:
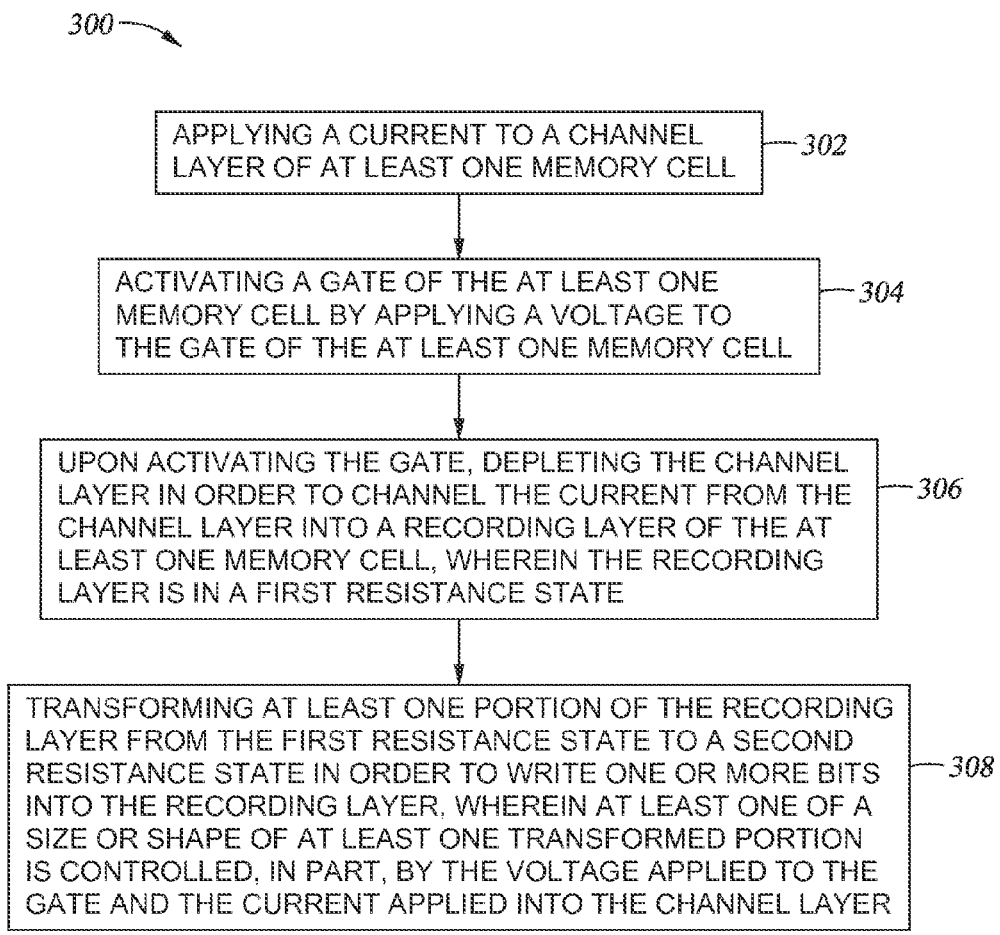
FIG. 3 is a flow diagram of example operations that may be used to record multiple bits in a memory cell, in accordance with embodiments of the present disclosure.

FIG. 3, for example, illustrates operations 300 that may be used to record (or write, store, program, etc.) multiple bits in at least one memory cell, such as memory cell 200, according to various embodiments of the present disclosure.

The operations may begin, at 302, where an electrical current may be applied to a channel layer of the memory cell. For example, according to some embodiments, the channel layer of the memory cell may be a semi-conductor material capable of supporting a depletion region. At 304, the gate of the memory cell may be activated by applying a voltage to the gate of the memory cell. At 306, upon activating the gate, the channel may be depleted in order to channel the current from the channel layer into a recording layer of a memory cell, wherein the recording layer is in a first resistance state (e.g., an amorphous state). For example, in one embodiment, depending on the amplitude of the voltage applied to the gate, a portion of the channel layer may be depleted (i.e., electrons may be depleted through the portion of the channel layer so that the portion is not able to conduct electricity) forcing (or deflecting, e.g., as a result of Coulomb's law) the current into the recording layer.

At 308, a portion of the recording layer may be transformed from the first resistance state to a second resistance state in order to write one or more bits in the recording layer, wherein the first resistance state and the second resistance state are different. In one embodiment where the recording layer is phase change material, for example, a portion of the recording layer may undergo a transition from a first resistance state to a second resistance state due to heating generated as a result of the current applied to the channel layer and deflected into the recording layer. In some cases (e.g., for phase change material), the first resistance state may be an amorphous state, the second resistance state may be a crystalline state and the transition from the amorphous state to the crystalline state may be achieved by applying a set current pulse. In other cases, (e.g., again referring to phase change material), the first resistance state may be the crystalline state, the second resistance state may be an amorphous state, and the transition from the crystalline state to the amorphous state may be achieved by applying a reset current pulse. In yet other cases, the first resistance state and second resistance state may be one of a plurality of intermediate states, depending on the particular properties of the phase change material utilized in the recording layer. For example, as described above, different alloys of a phase change material may have different material properties, such as glass transition temperatures, melting point temperature, etc. that may affect the order of magnitudes between resistance states.

According to some embodiments, at least one of a size and shape of the at least one transformed portion may be controlled, in part, by the voltage applied to the gate and the current applied into the channel layer. For example, as will be described in more detail below, depending on the size and/or shape of each of the at least one transformed portions, different levels may be achieved, which may allow for multi-bit recording.

Figure 4A:
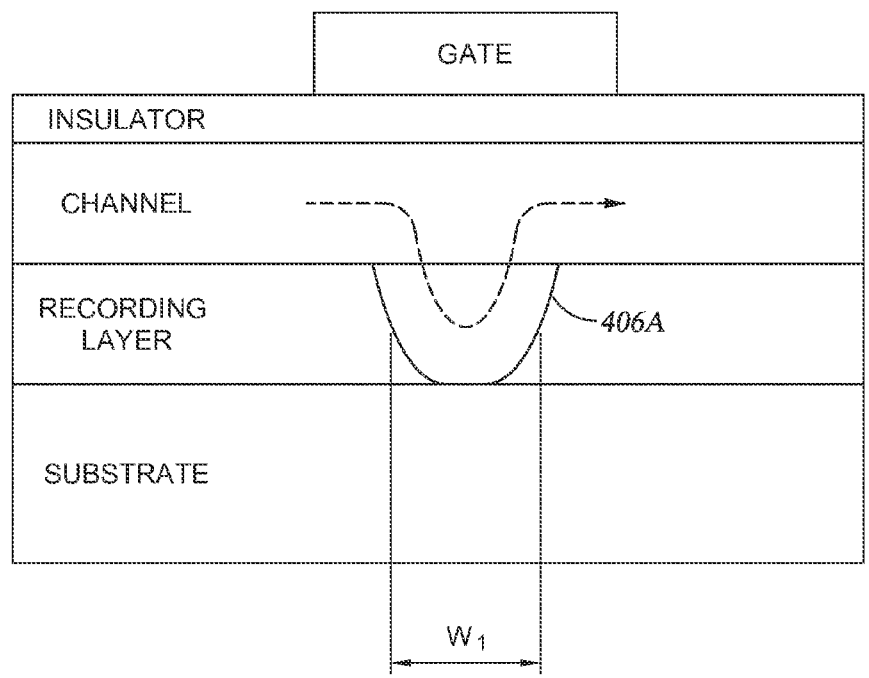
FIGS. 4A-4C illustrate different examples of controlling the size and/or shape of a recorded bit, in accordance with embodiments of the present disclosure.
Figure 4A:
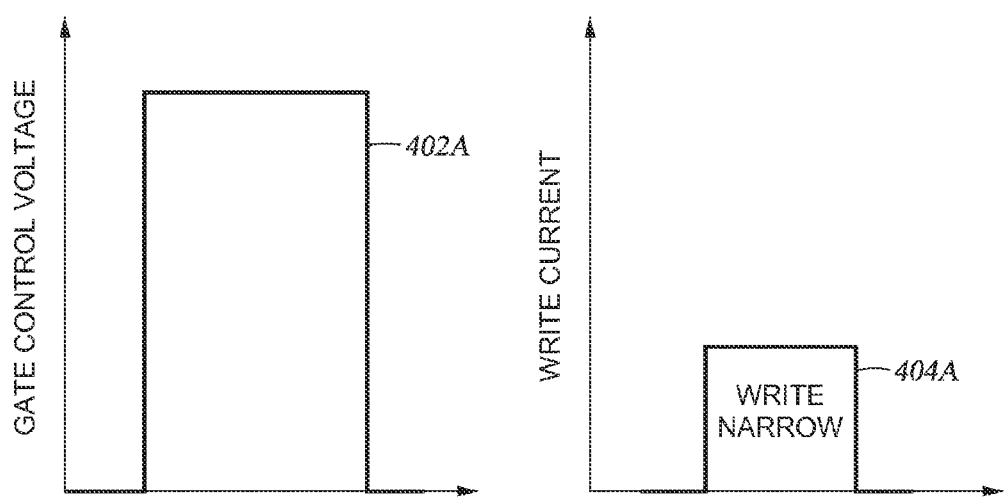
Figure 4B:
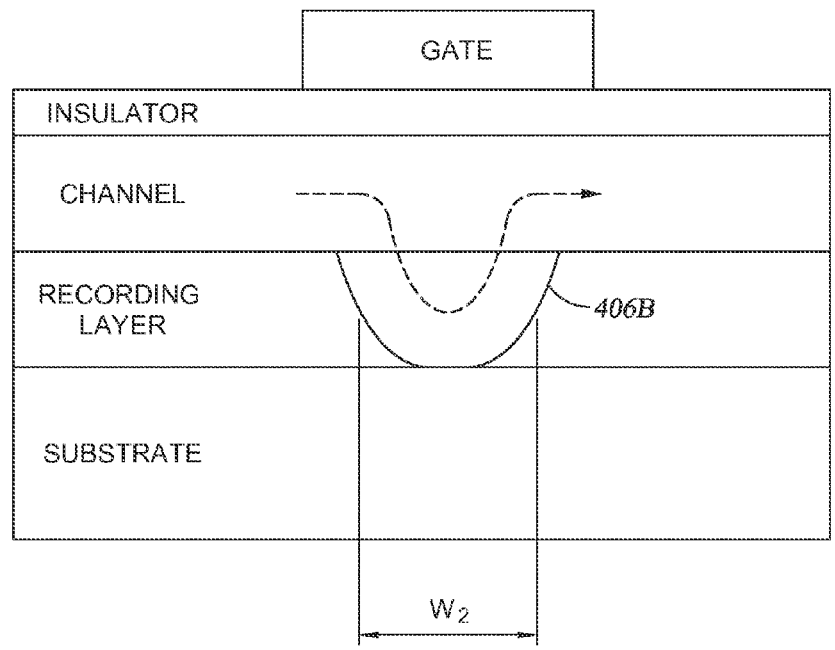
Figure 4B:
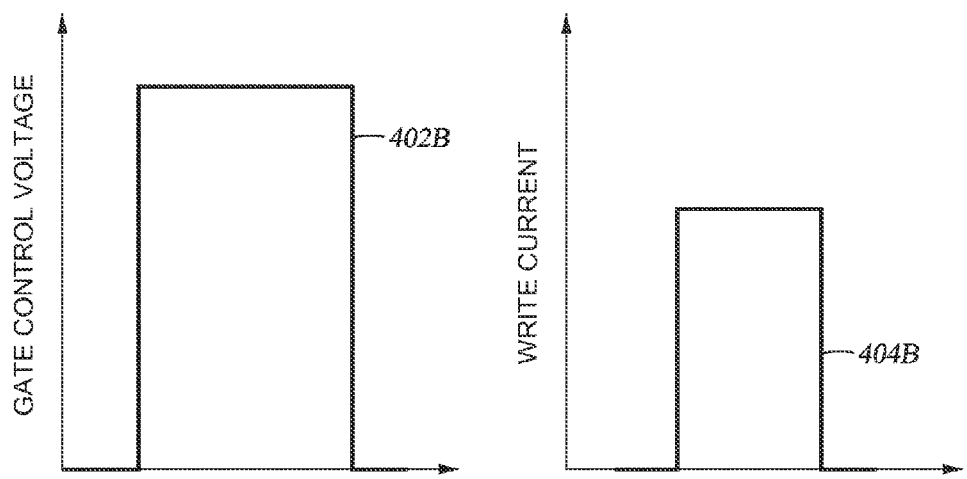
Figure 4C:
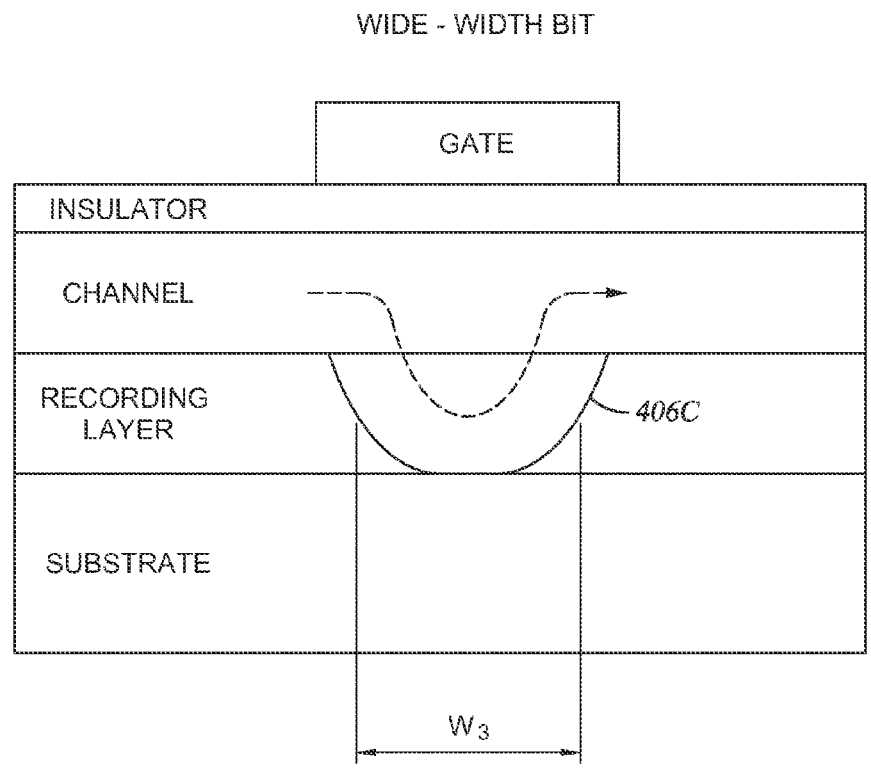
Figure 4C:
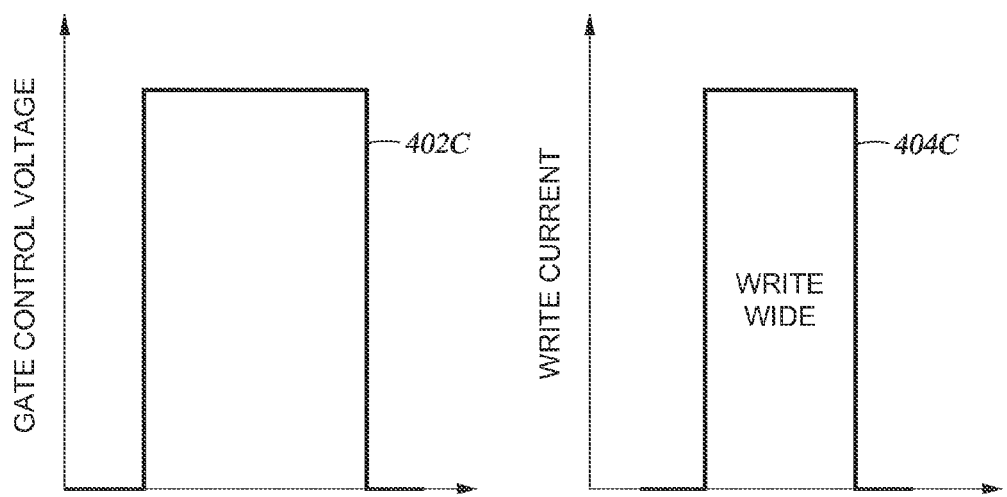

In one embodiment of the present disclosure, controlling the size and/or shape of the one or more bits in the recording layer may include controlling the width of each transformed portion of the recording layer. FIGS. 4A-4C, for example, illustrate an example of how three different levels of recording (with three different width recorded regions) may be achieved, in part, from controlling the voltage and/or current applied to the memory cell, in accordance with an embodiment of the present disclosure. Each of the memory cells shown in FIGS. 4A-4C, respectively, may be an example of the memory cells disclosed in FIGS. 2, 8, 11, etc.

As shown in FIGS. 4A-4C, voltage signals (pulses) 402A, 402B, 402C and write current signals (pulses) 404A, 404B, 404C may be used to control the width of recorded bit regions 406A, 406B, and 406C, respectively, in each of the memory cells. According to this embodiment, the width of the recorded bit regions 406A, 406B and 406C (in each of the memory cells) may be controlled by applying constant voltage signals to the gate of the memory cell and varying the write current signals that are applied to the channel of the memory cell.

In one example, a narrow-width bit of width $w_1$ (e.g., one level) may be recorded (as shown in FIG. 4A) by applying a voltage signal 402A of constant amplitude to the gate of the memory cell and applying a write current signal 404A of low amplitude. In another example, a medium-width bit of width $w_2$ (e.g., a second level) may be recorded (as shown in FIG. 4B) by applying a voltage signal 402B of constant amplitude to the gate of the memory cell and applying a write current signal 404B of medium amplitude. In yet another example, a wide-width bit of width $w_3$ (e.g., a third level) may be recorded (as shown in FIG. 4C) by applying a voltage signal 402C of constant amplitude to the gate of the memory cell and applying a write current signal 404C of high amplitude. In general, by applying a constant gate voltage and varying the current (e.g., as shown in FIGS. 4A-4C), it may be possible to record all the way through the depth of the recording layer for portions of the recording layer that are directly under the gate. However, as the current travels through the recording layer into portions that are not directly under the gate, the current may not penetrate as deeply, which may allow for different width regions (such as transformed regions 406A-406C) to be possible.

Although the voltage signals 402A-C and write current signals 404A-C are shown as square pulses, the voltage signals 402A-C and write current signals 404A-C may also be in the form of a number of different shaped pulses (e.g., such as triangular shaped, etc.). Further, although not shown, both the amplitude and/or temporal width of the voltage and write current signals may be controlled.

In one embodiment of the present disclosure, controlling the size and/or shape of the one or more bits in the recording layer may include controlling the depth of each transformed portion of the recording layer.

Figure 5A:
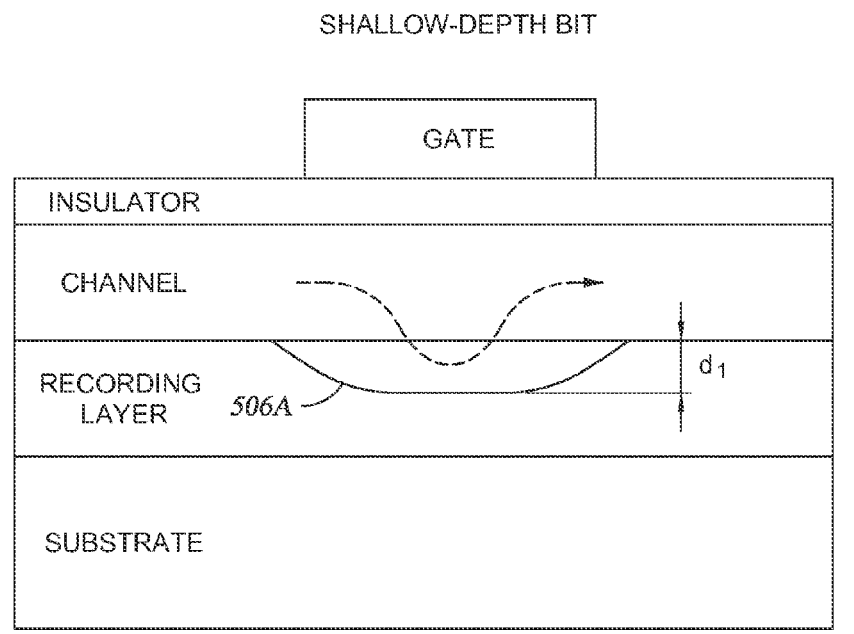
FIGS. 5A-5C illustrate different examples of controlling the size and/or shape of a recorded bit, in accordance with another embodiment of the present disclosure.
Figure 5A:
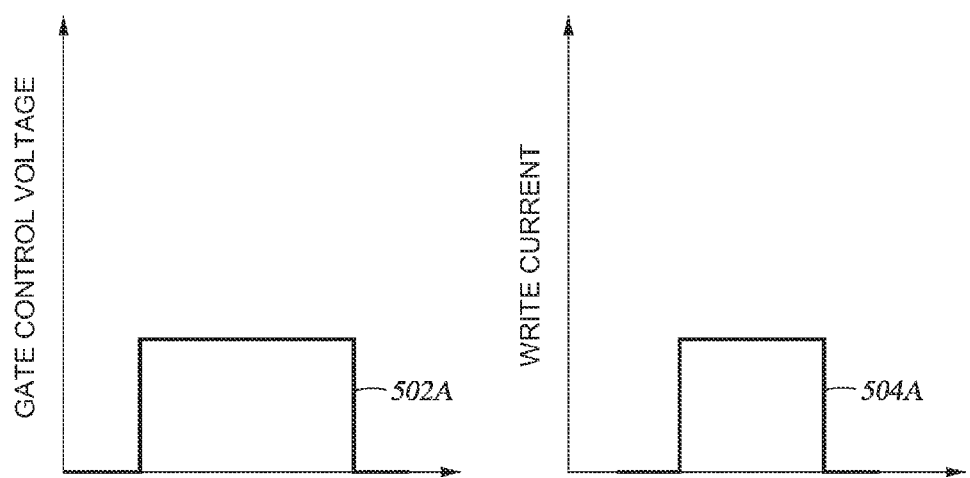
Figure 5B:
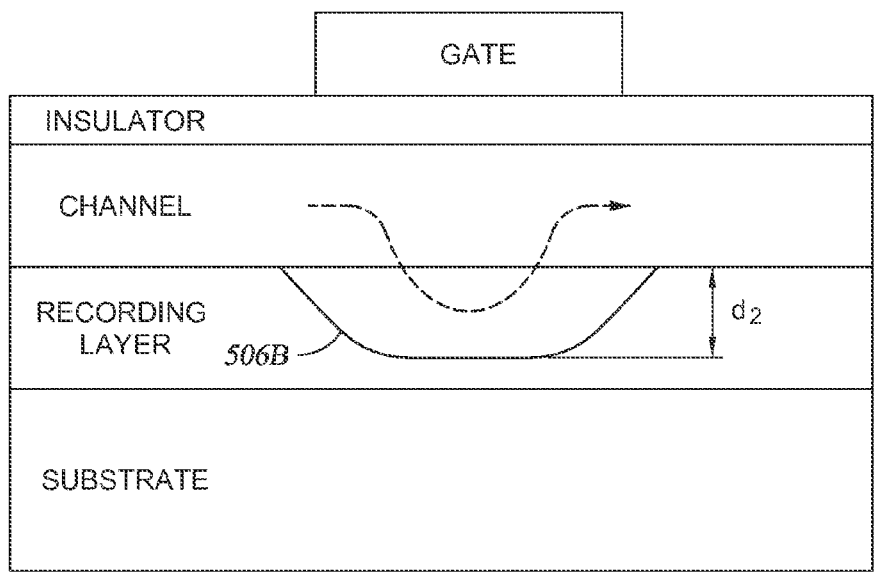
Figure 5B:
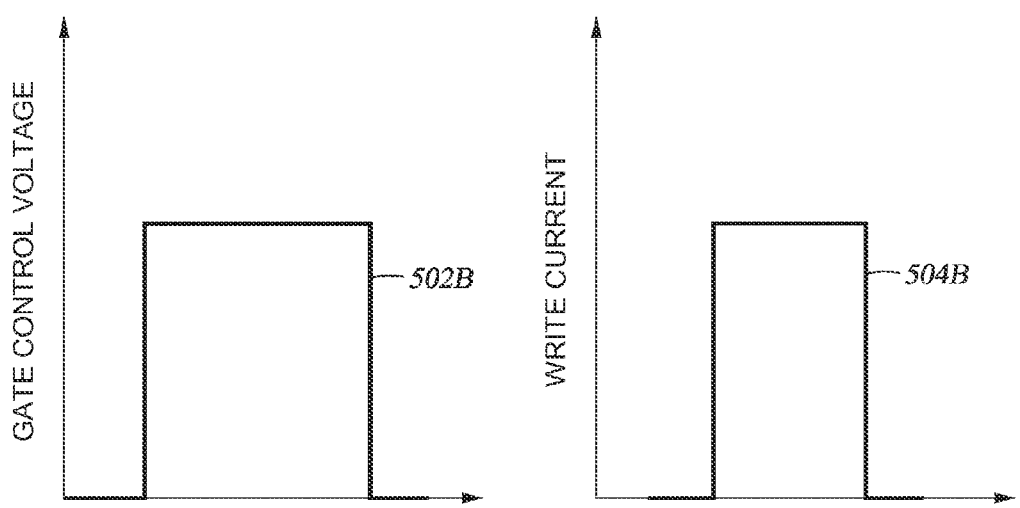
Figure 5C:
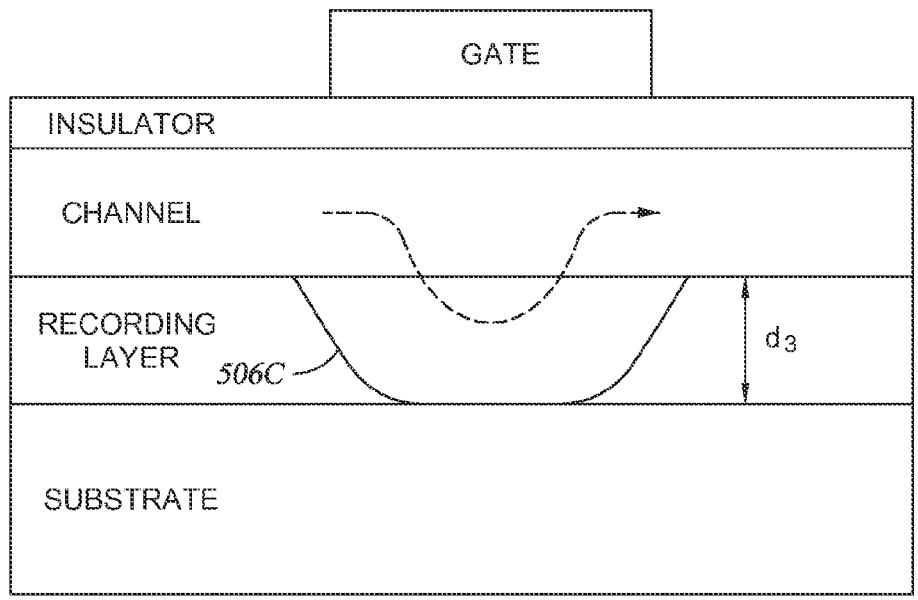
Figure 5C:
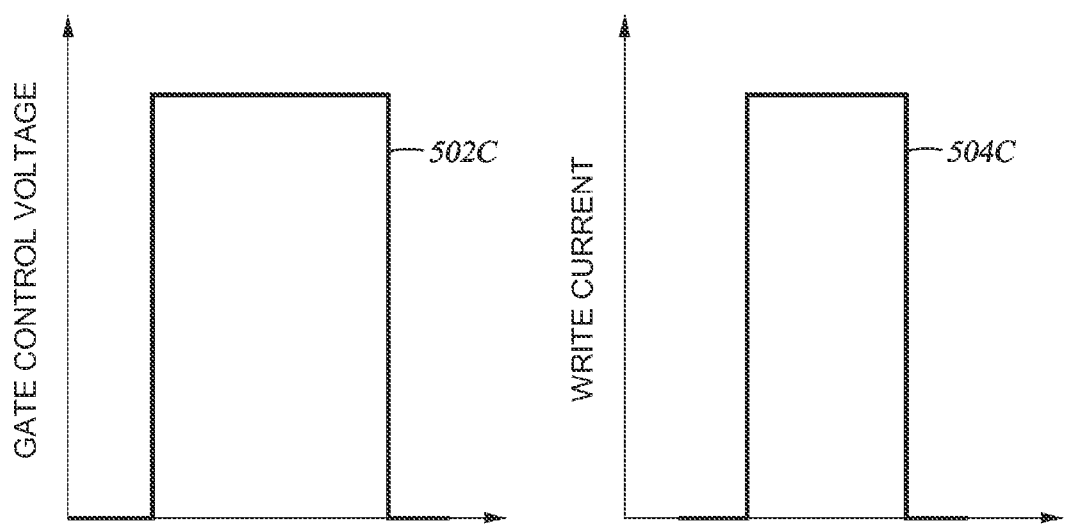

FIGS. 5A-5C illustrate another example of how multiple (e.g., three) different levels of recording (with three different width recorded regions) may be achieved, in part, from controlling the voltage and/or current applied to the memory cell, in accordance with another embodiment of the present disclosure. Each of the memory cells shown in FIGS. 5A-5C, respectively, may be an example of the memory cells shown in FIGS. 2, 8, 11, etc.

As shown in FIGS. 5A-5C, voltage signals (pulses) 502A, 502B, 502C and write current signals (pulses) 504A, 504B, 504C may be used to control the depth of recorded bit regions 506A, 506B, and 506C, respectively, in each of the memory cells. According to this embodiment, the depth of the recorded bit regions 506A, 506B and 506C (in each of the memory cells) may be controlled by varying the amplitude and/or temporal width of voltage signals applied to the gate of the memory cell and varying the amplitude and/or temporal width of write current signals applied to the channel of the memory cell. Varying the amplitude and/or the temporal width of the voltage and current signals in this manner may provide a finer level of control (e.g., as compared to controlling only the write current) over each portion of the recording layer that is transformed into a different resistance state.

As shown (e.g., in FIG. 5A), a shallow-depth bit of depth $d_1$ (e.g., one level) may be recorded by applying the voltage signal 502A and the write current signal 504A. As shown in FIG. 5B, a medium-depth bit of depth $d_2$ may be recorded by applying the voltage signal 502B and the write current signal 504B. In one example, the voltage signal 502B may be different (i.e., may vary in terms of amplitude, shape, temporal width, etc.) from voltage signal 502A. For example, the voltage signal 502B may have a different amplitude and/or temporal width from the voltage signal 502A. In one example, the write current signal 504B may be different from write current signal 504A. For example, the write current signal 504B may also have a different amplitude and/or temporal width from the write current signal 504A.

As shown in FIG. 5C, a full-depth bit of depth $d_3$ may be recorded by applying the voltage signal 502C and the write current signal 504C. In one example, the voltage signal 502C may be different (e.g., may vary in terms of amplitude, shape, temporal width, etc.) from the voltage signal 502B and the voltage signal 502A. Similarly, the write current signal 504C may also be different from the write current signal 504B and the write current signal 504A.

Further, although not shown in FIGS. 5A-5C, techniques presented herein may also allow for controlling the depth of the different regions 506A-506C by applying a constant current signal to each of memory cells while varying the voltage applied to each of the memory cells.

Although the voltage signals 502A-C and write current signals 504A-C are shown as square pulses, the voltage signals 502A-C and write current signals 504A-C may also be in the form of a number of different shaped pulses (e.g., such as triangular shaped, of different temporal width, etc.). Further, although, in general, each of the memory cells shown in FIGS. 4A-4C and 5A-5C shown a single bit recorded region (e.g., for one bit), the techniques presented herein may also be applicable to more than one bit (e.g., two bits, three bits, etc.).

As mentioned above, in some examples, the storage device (e.g., shown in FIG. 1) may include an array of memory cells with one or more memory cells connected in a string. A string, as used herein, may refer to two or more cells that are linearly connected.

FIG. 6, for example, illustrates an architecture of a string 600 of memory cells, according to various embodiments of the present disclosure. As shown, a string of three memory cells (e.g., memory cell 602, 604 and 606), where each memory cell 602, 604 and 606 has its own gate, may be connected in such a way that each memory cell 602, 604 and 606 may share at least one of an insulator layer, a channel layer, recording layer and substrate. The insulator layer, channel layer, recording layer and substrate (shown in FIG. 6) may be examples, respectively, of the insulator layer 204, channel layer 206, recording layer 208 and substrate 210 shown in FIG. 2. As such, the materials that may be utilized for the insulator layer, channel layer, recording layer and substrate (shown in FIG. 6) may be the same as the materials utilized for the insulator layer 204, channel layer 206, recording layer 208 and substrate 210 of FIG. 2, respectively.

In some embodiments, the materials utilized for the insulator layer, channel layer, recording layer and/or substrate (shown in FIG. 6) may be the same for each of the memory cells in the string 600. In other embodiments, the materials utilized for the insulator layer, channel layer, recording layer and/or substrate may be different for each of the memory cells in the string 600. Referring to the recording layer in FIG. 6, for example, in some cases, utilizing the same (or different) materials for the recording layer for each of the memory cells in the string may provide greater control over the different resistance states that may be achieved between the different cells. For example, in some cases, for PCM, different alloys of a phase change material (e.g., such as GST) may be utilized for the different recording layers.

As noted above, in some embodiments, the techniques presented herein allow for recording bit regions of different sizes and/or shapes for each memory cell in a string of memory cells. For example, referring to string 600, the techniques presented herein may be used to record a bit region for memory cell 602 that has a different size and/or shape than a recorded bit region for memory cell 604 and memory cell 606.

In one embodiment, programming (or writing) to each of the memory cells 602, 604, and 606 may be done sequentially (i.e., one at a time) in order to record a different size and/or shape bit region for each of the memory cells 602, 604 and 606 (in a string 600). Writing sequentially may involve programming one memory cell at a time by turning off gates to any other memory cell in the string that is not currently being programmed. In general, when a current is applied to the channel of a string of memory cells, the current will be deflected into the recording layer in only the memory cell that has its gate turned on (e.g., with a voltage applied to the gate). For the remaining memory cells (e.g., in which a zero voltage is applied to the gate), the current will continue to flow through the channel.

Figure 7A:
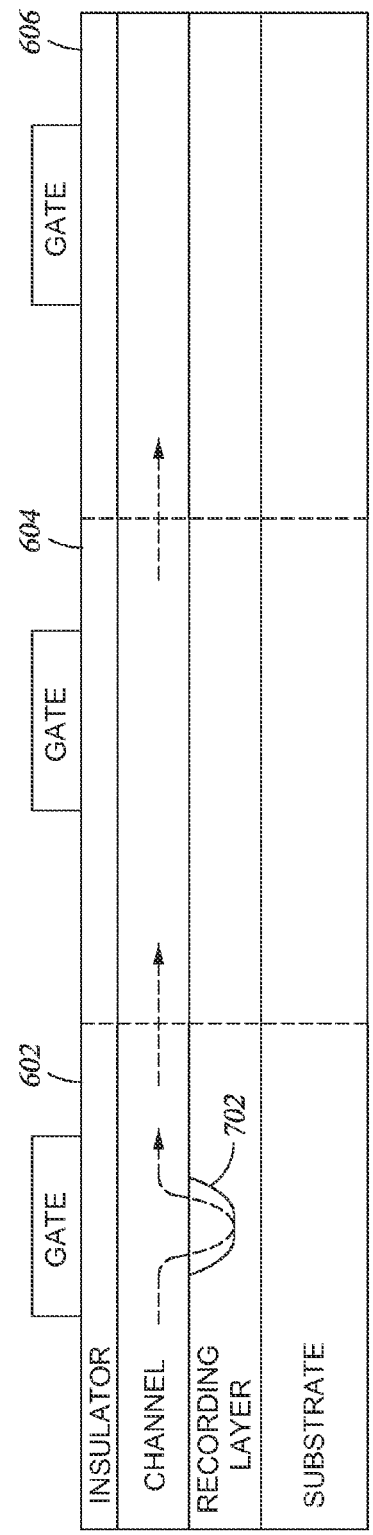
FIGS. 7A-7C illustrate an example of how a string of memory cells may be programmed, in accordance with embodiments of the present disclosure.
Figure 7B:
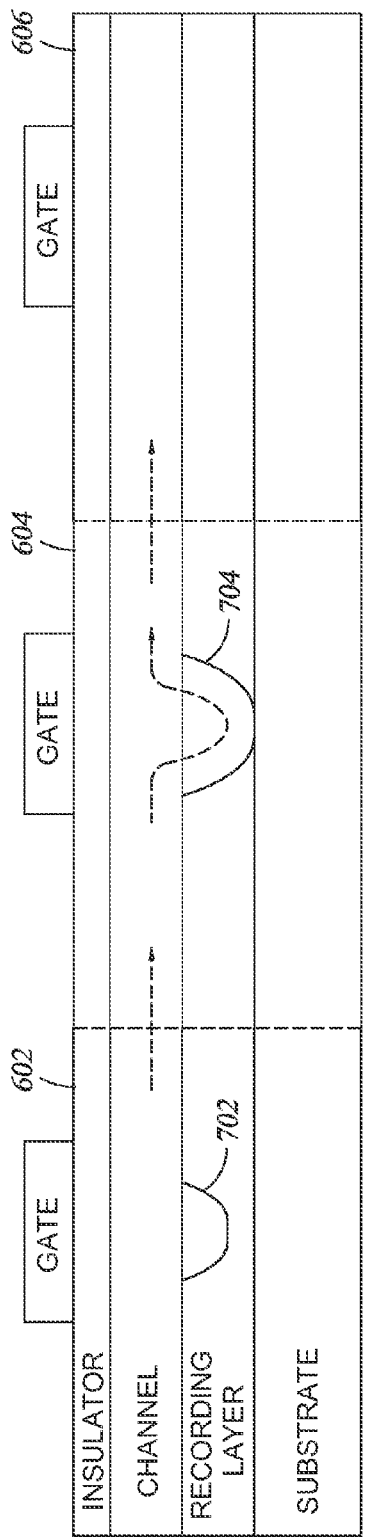
Figure 7C:
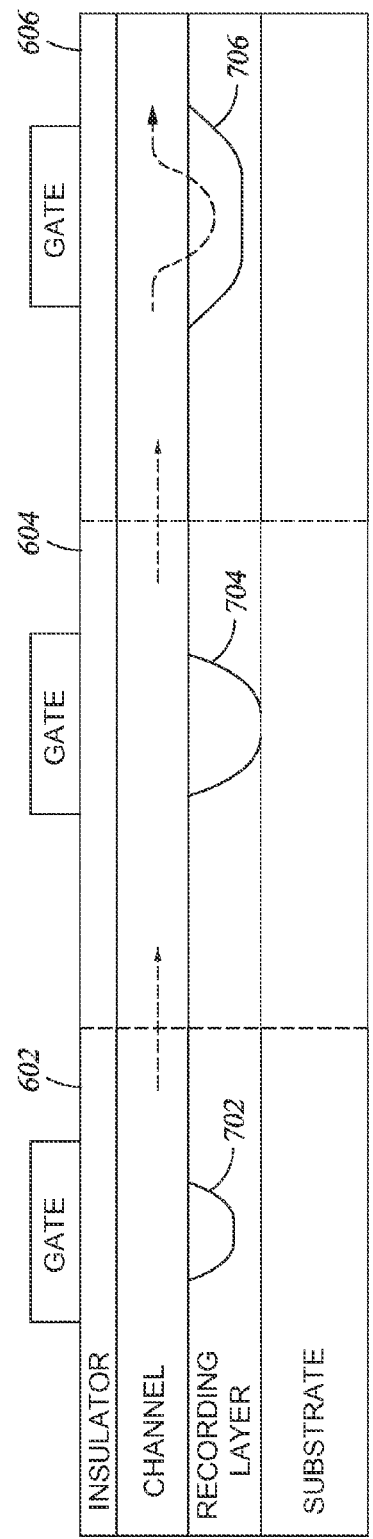

As shown in FIG. 7A, for example, in one case, a bit region 702 may be recorded in the memory cell 602 first (e.g., with gates to memory cells 604 and 606 turned off) by applying a voltage signal to the gate of memory cell 602 and applying a write current signal to the channel. As shown in FIG. 7B, after recording bit region 702, a bit region 704 may be recorded in the memory cell 604 (e.g., with gates to memory cells 602 and 606 turned off) by applying a voltage signal to the gate of memory cell 604 and applying a write current signal to the channel. Lastly, as shown in FIG. 7C, after recording bit region 704, a bit region 706 may be recorded in the memory cell 606 (e.g., with gates to memory cells 602 and 604 turned off) by applying a voltage signal to the gate of memory cell 606 and applying a write current signal to the channel. In general, however, recording of each memory cell in this sequential manner may continue for any number of memory cells that may be connected in a string.

In the embodiment shown in FIGS. 7A-7C, different size and/or shaped bit regions 702, 704 and 706 may be obtained for each of the memory cells 602, 604 and 606 in the string 600 by utilizing the techniques described above with reference to FIGS. 4A-4C and 5A-5C. For example, as described above, different widths for bit regions 702, 704 and 706 may be obtained by applying the same voltage to the memory cells (when they are on) and varying the current signal applied to the channel for each of the memory cells. In another example, as described above, different depths for bit regions 702, 704 and 706 may be obtained by varying (or applying) different gate voltages and different write currents to each of the memory cells. In yet another example, different depths for bit regions 702, 704 and 706 may be obtained by applying a constant write current signal to the channel for each of the memory cells and varying the gate voltages applied to each of the memory cells.

In another embodiment (which is not shown), programming (or writing) to each of the memory cells 602, 604, and 606 may be done in parallel (or simultaneously) in order to record different sized and/or shaped bit regions for each of the memory cells 602, 604 and 606 in string 600. In general, when writing simultaneously, the current applied to the channel may be the same for each of the memory cells and the gate voltages applied to each of the memory cells may be different. In this manner, it may be possible to control the depth of each of the bit regions that are recorded in the memory cells. In this embodiment, since, in general, each of the memory cells may be on (e.g., with a voltage applied to the gates of each of the memory cells) when programming the cells simultaneously and each of the different recording layers within the memory cells may have different orders of magnitude of resistance, in some examples, a current driver may be utilized to maintain a constant current through each of the memory cells. In other examples, a feedback circuit (with a mechanism that is able to dynamically sense the current, provide feedback and adjust the voltage applied to each of the memory cells) may be utilized to maintain a constant current through each of the memory cells.

According to various embodiments, the techniques presented herein may also allow for recording one or bits within a layer of recording material (e.g., phase change material, ReRAM, etc.) by extending the depletion area (from the channel layer) into the recording layer.

Figure 8:
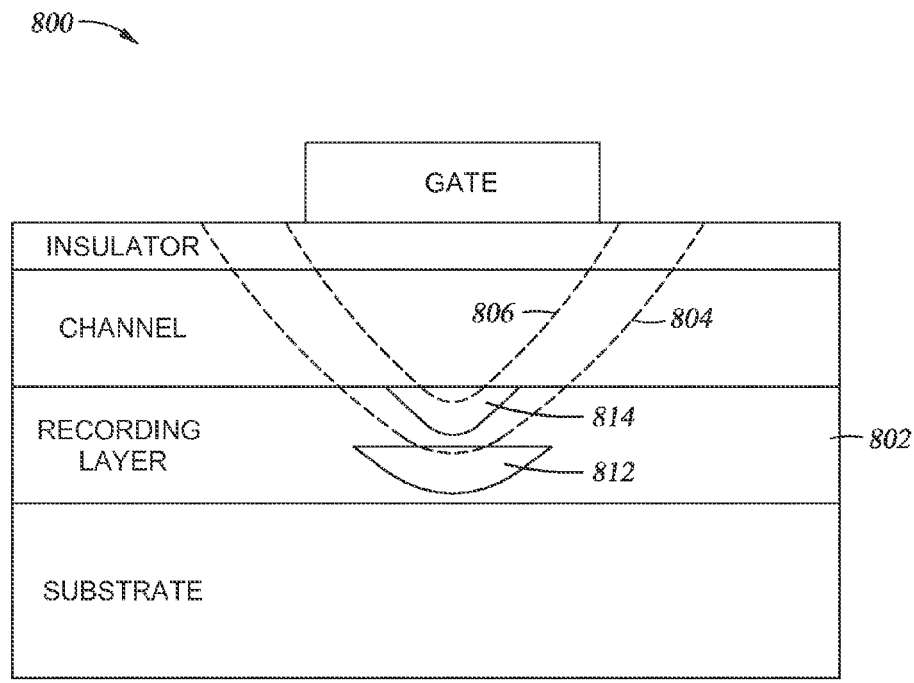
FIG. 8 illustrates an example architecture of a memory cell with a recording layer capable of supporting a depletion region, in accordance with embodiments of the present disclosure.
Figure 8:
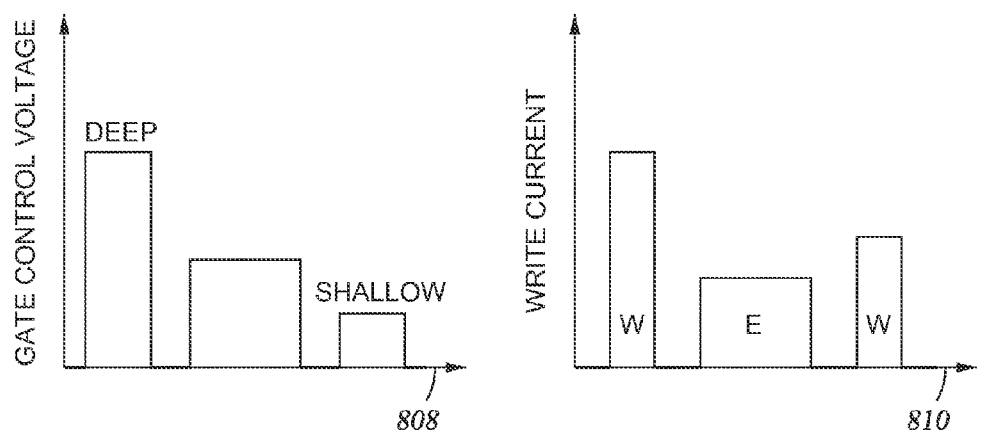

FIG. 8, for example, illustrates an example architecture of a memory cell 800 with a recording layer capable of supporting a depletion region, according to various embodiments of the present disclosure. As shown, the memory cell 800 may include an oxide layer, which may be used as a type of insulator (e.g., to prevent current from flowing back through the gate of memory cell 800) and may be similar to insulator layer 204 shown in FIG. 2. In addition, the memory cell 800 may include a channel layer and a substrate, both of which may be similar to the channel layer 206 and substrate 210, respectively, shown in FIG. 2. For example, the channel layer (of memory cell 800) may include a semiconductor material capable of supporting depletion. The memory cell 800 may further include a recording layer 802 for storing one or more bits. In this embodiment, the recording layer 802 may (in addition to the channel layer) be capable of supporting a depletion region, such that when the gate of the memory cell 800 is activated, little to no current may flow through portion of the recording layer that is depleted.

In some embodiments, multiple independent transformed regions (each of may be used to store a bit) may be created in the recording layer by controlling the depth of the depletion area into the recording layer 802. For example, as shown in FIG. 8, based on the voltage signals (in the voltage signal sequence 808) applied to the gate of the memory cell 800, the depth of the depletion area into the recording layer (e.g., which may include phase change material) may be controlled to extend to a first depletion extension 804 and a second depletion extension 806 (represented by dashed lines in FIG. 8). As a result of depleting to a first depletion extension 804 and second depletion extension 806, the current applied to the memory cell 800 (e.g., with the current signal sequence 810) may be used to transform a first independent region 812 and a second independent region 814, respectively, into one of two resistance states. Each transformed region (or portion) may correspond to a bit. Thus, in this embodiment, the first independent region 812 may be transformed into one (of the two) resistance states to store a bit and the second independent region 814 may be transformed into one (of the two) resistance states to store another bit.

Figure 9:
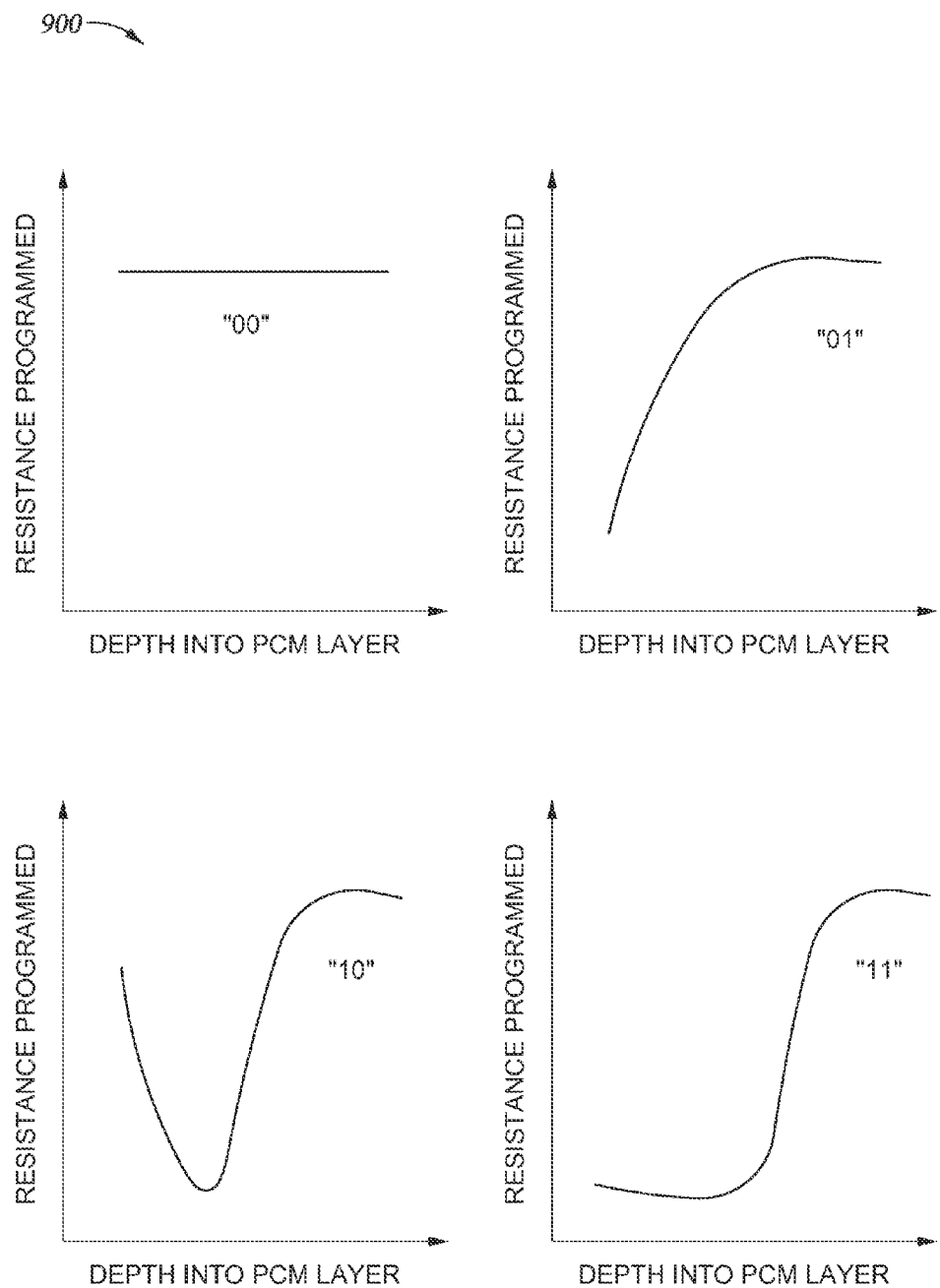
FIG. 9 is a graph that illustrates example coding of resistance topologies for a memory cell, in accordance with embodiments of the present disclosure.

In this manner, one or more resistance topologies may be encoded for the memory cell 800. The number of resistance topologies that are encoded may depend on the number of bits stored in the memory cell. For example, as shown in graph 900 of FIG. 9, the two bits (e.g., represented by independent transformed regions 812 and 814) stored in the memory cell 800 may code for four different topologies (profiles) in resistance value, wherein each resistance profile is a function of the depth into the recording layer 802. A first resistance profile may represent "00;" a second resistance profile may represent "01;" a third resistance profile may represent "10;" and a fourth resistance profile may represent "11."

In an embodiment, the read and write operation (e.g., for memory cell 800) may be performed independently on a per cell basis. For example, when reading a plurality of memory cells 800, the gate for any individual cell may be individually turned on (e.g., to deflect read current into the cell) to access a particular cell or the cell may be invisible while reading other cell(s). Upon reading the memory cell 800, the entire resistance topology may be read and the two bits may be decoded together. Even if the absolute values of the resistances vary from cell-to-cell, the decoder may still decode correctly, two bits at a time. Doing so in this manner may provide improved robustness against variation for both read and/write operations, may enable subtraction of interconnect resistance and correction for cell-to-cell variation, etc.

Although the memory cell 800 shows two bits being stored, the techniques described herein may be used to store more than two bits. The memory cell 800 may be compatible with memory types that are able to implement high speed read operations (e.g., such as SRAM). In addition, the techniques described herein may be extendible to multiple-cell inter-symbol interference correction. For example, with reference to FIG. 8, the techniques described herein may allow for measuring adjacent resistance topologies (e.g., "00," "01," "10," "11") on either side of the one which needs to be detected.

In general, for the various embodiments described herein, the process of writing one or bits to a memory cell (e.g., with a sequence of voltage and current signals) may be based on an iterative programming algorithm (e.g., such as a write-verify algorithm, read-verify-write algorithm, etc.). The iterative programming algorithm may be used to achieve desired separation between the different transformed regions (e.g., either within a single phase change layer, or as will be described below, between multiple different phase change layers).

In some embodiments (not shown), the memory cell 800 may include multiple recording layers for storing one or more bits. Each of the different layers may have different characteristics (e.g., different material properties) such that when portions of the different layers are transformed and/or shaped (e.g., utilizing the techniques described herein) different resistance states may be achieved. In this embodiment, by extending the depletion (e.g., based on a voltage applied to the gate of the memory cell) area from the channel layer into the multiple layers of a given recording layer material (such as phase change), one or more bits may be written into each layer (e.g., based on current signals deflected into the one or more layers).

In general, (e.g., referring to phase change material) when programming a memory cell with multiple phase change layers, the programming may be in the order of deepest phase change layer to shallowest phase change layer. For example, in one case, the deepest phase change layer of a memory cell may be programmed first (e.g., by controlling the depth of the depletion area into the deepest layer) and applying a write current signal that transforms a portion of the deepest layer to store a bit. Next, a layer above the deepest layer may be programmed by receding the depletion area (e.g., into the layer above the deepest layer) and applying a write current signal that transforms a portion of the layer above the deepest layer to store a bit. This process may continue in this manner until the depletion area is receded into the shallowest phase change layer and a write current signal is applied to store a bit in the shallowest phase change layer. In addition, according to some embodiments, multiple bits may be written into each phase change layer, e.g., utilizing the techniques described above with reference to FIG. 8.

In some cases, when utilizing a memory cell with multiple phase change layers and a channel layer (e.g., as shown in FIG. 8), there may be defects in the channel layer that may limit (or prevent) controlling the depth of the depletion area into the multiple phase change layers. As such, it may be desirable to provide a memory cell architecture that may be able to account for these concentrations of defects in the channel layer.

Figure 10:
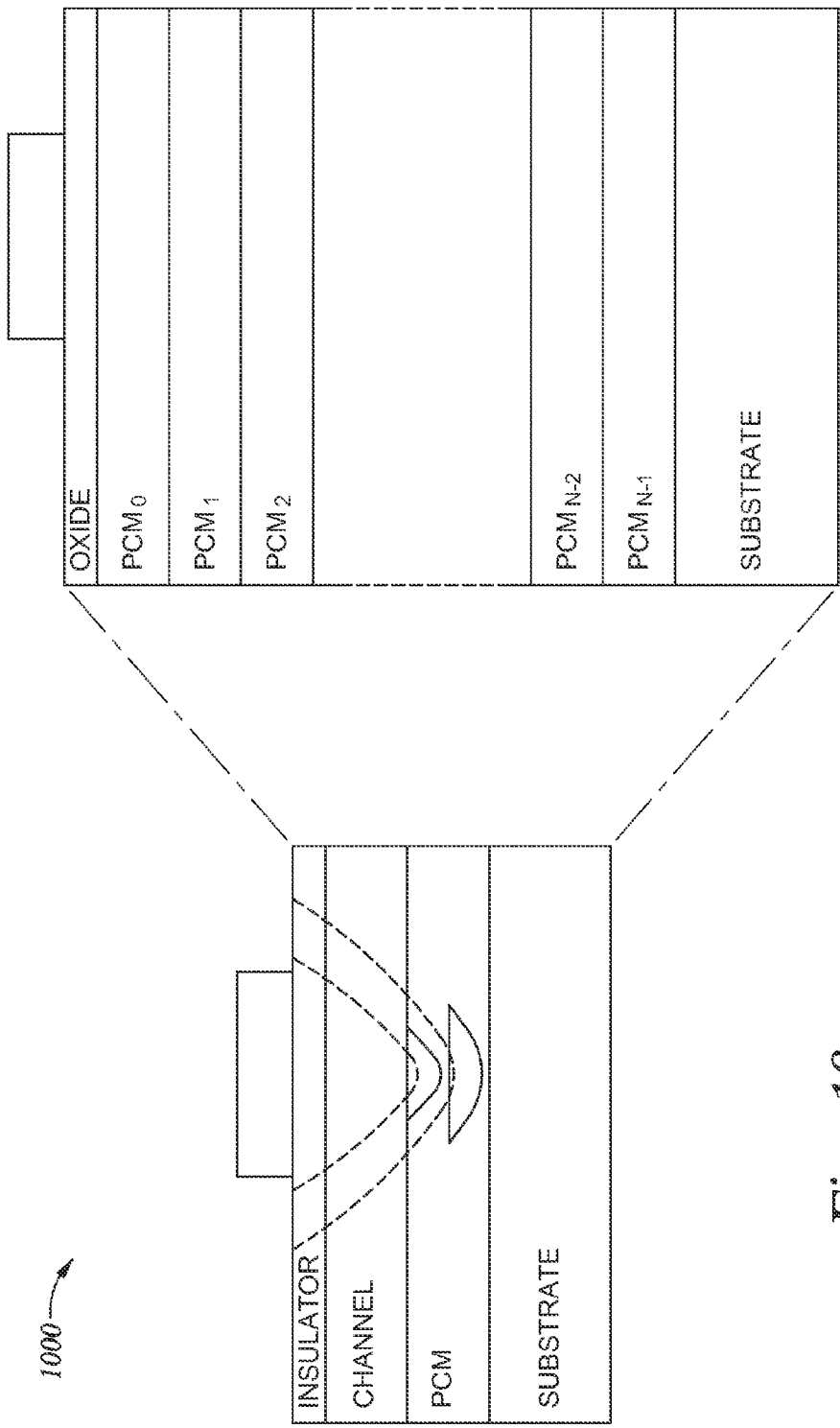
FIG. 10 illustrates an example architecture of a memory cell with multiple phase change layers, in accordance with embodiments of the present disclosure.

FIG. 10 illustrates an architecture of a memory cell 1000 with multiple phase change layers, according to another embodiment of the present disclosure. As shown, the memory cell 1000 may include a gate, an oxide layer and a gate, each of which may be similar to the gates, oxide layers, and substrates in embodiments described above (e.g., in FIG. 2, etc.). However, as also shown, rather than including a channel layer between the oxide layer and the phase change layer, the memory cell 1000 may instead include a total of N phase change layers, $PCM_0$, $PCM_1$, $PCM_2$, . . . , $PCM_{N-2}$, $PCM_{N-1}$. Each phase change layer may have different properties, such as different programming temperatures, orders of magnitude of resistance, electrical conductivity, and the like. For example, $PCM_{N-1}$ may have the highest order of magnitude of resistance and the lowest conductivity of the different layers, whereas $PCM_0$ may have the lowest order of magnitude of resistance and the highest conductivity of the different layers. In this embodiment, $PCM_0$ may function as a channel layer. In some cases, by utilizing a memory cell (such as memory cell 1000) that does not have a channel layer, it may be possible to reduce the occurrence of defects that may limit controlling the depletion area into the different PCM layers.

In general, the various techniques (e.g., to store multiple bits, control the size and/or shape of the bits, control depletion depth, etc.) described herein may be used to improve volumetric density of several different non-volatile memory types (e.g., such as PCM, ReRAM, etc.). For example, as described above, the techniques described herein may be used to convert a 2-d planar recording media into a 3-d volumetric media and/or be used to write multiple bits in a region where the shape of the region is controlled by one gate. In addition, the techniques described herein may be used to convert a 3-d recording media into a 3-d media which can store multiple bits of information in each cell. This can apply to both horizontal channel 3-d memory as well as vertical channel 3-d memory.

The various techniques described herein may also be used to compensate for cell-to-cell variability, be used to reduce cost per GB (e.g., no additional lithography steps may be need to record more than one data bit in a region) and/or be compatible with low and high speed readout memory and storage architectures.

While the foregoing is directed to embodiments of the present invention, other and further embodiments of the invention may be devised without departing from the basic scope thereof, and the scope thereof is determined by the claims that follow.

The various illustrative logical blocks, modules, and circuits described in connection with the disclosure herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various operations of methods described above may be performed by any suitable means capable of performing the corresponding functions. The means may include various hardware and/or software component(s).

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for recording one or more bits in at least one memory cell, comprising:
    applying a current to a channel layer of the at least one memory cell;
    activating a gate of the at least one memory cell by applying a voltage to the gate of the at least one memory cell;
    upon activating the gate, depleting the channel layer in order to channel the current from the channel layer into a recording layer of the at least one memory cell, wherein the recording layer is in a first resistance state; and
    transforming at least one portion of the recording layer from the first resistance state to a second resistance state in order to write one or more bits into the recording layer, wherein the first resistance state and the second resistance state are different, and wherein at least one of a size or shape of the at least one transformed portion of the recording layer is controlled, in part, by the voltage applied to the gate and the current applied into the channel layer.

2. The method of claim 1, wherein the recording layer comprises one of phase change material or resistive random access memory material.

3. The method of claim 1, wherein transforming the at least one portion of the recording layer to write one or more bits comprises transforming a first portion of the at least one portion to a resistance state and transforming a second portion of the at least one portion to a different resistance state, wherein each transformed portion corresponds to a recorded bit.

4. The method of claim 1, wherein controlling the at least one of the size and shape of the at least one transformed portion comprises controlling a width of the at least one transformed portion by applying a constant voltage to the gate and varying the current applied to the channel layer.

5. The method of claim 1, wherein controlling the at least one of the size or shape of the at least one transformed portion comprises controlling a depth of the at least one transformed portion by varying a voltage applied to the gate of the at least one memory cell and varying a current applied to the channel of the at least one memory cell.

6. The method of claim 1, wherein the at least one memory cell comprises a plurality of memory cells connected in a string.

7. The method of claim 6, further comprising:
    sequentially writing to each of the plurality of memory cells one at a time by turning off the gates of any memory cells not being written to.

8. The method of claim 6, further comprising:
    simultaneously writing to each of the plurality of memory cells by applying a constant current signal and varying the voltage applied to each of the plurality of memory cells.

9. The method of claim 1, further comprising, upon activating the gate:
    extending the depletion of the channel layer into the recording layer of the at least one memory cell; and
    controlling a depth of the extension of the depletion into the recording layer, based on the voltage applied to the gate, in order to write one or more bits.

10. The method of claim 9, further comprising:
    encoding a plurality of resistance topologies based on a number of the one or more bits written into the recording layer.

11. The method of claim 1, wherein controlling the at least one of the size or shape of the at least one transformed portion comprises controlling a depth of the at least one transformed portion by varying at least one of a time that a voltage is applied to the gate of the at least one memory cell and a time that a current is applied to the channel of the at least one memory cell.

12. An adjustable non-volatile memory cell, comprising:
    a gate;
    at least one recording layer; and
    a channel layer, capable of supporting a depletion region, disposed between the gate and the at least one recording layer, wherein current is initially flowing through the channel layer, wherein upon activating the gate, the channel layer is depleted and the current initially flowing the channel layer is steered through the at least one recording layer, wherein a portion of the at least one recording layer is capable of being transformed from a first resistance state to a second resistance state, based on the current steered through the at least one recording layer, and wherein at least one of a size or shape of the transformed portion is capable of being controlled in order to store at least one bit.

13. The adjustable non-volatile memory cell of claim 12, wherein a plurality of portions of the at least one recording layer are capable of being transformed from a first resistance state to a second resistance state, based on a sequence of current signals steered through the at least one recording layer, and wherein at least one of a size or shape of each of the plurality of transformed portions is capable of being controlled in order to store a plurality of bits.

14. The adjustable non-volatile memory cell of claim 13, wherein a width of each of the plurality of transformed portions is capable of being controlled by a constant voltage applied to the gate and a varying current sequence applied to the channel layer.

15. The adjustable non-volatile memory cell of claim 13, wherein a depth of each of the plurality of transformed portions is capable of being controlled by a varying current sequence applied to the channel layer and a varying voltage applied to the gate.

16. The adjustable non-volatile memory cell of claim 12, wherein the at least one recording layer is capable of supporting a depletion region.

17. The adjustable non-volatile memory cell of claim 16, wherein a plurality of portions of the at least one recording layer are capable of being transformed from a first resistance state to a second resistance state based on extension of a depth of the depletion region into the at least one recording layer.

18. The adjustable non-volatile memory cell of claim 12, wherein the at least one recording layer comprises at least one of phase change material and resistive random access memory material.

19. The adjustable non-volatile memory cell of claim 12, wherein the at least one recording layer comprises a plurality of layers, each layer having different material properties.

20. A system, comprising:
a plurality of memory cells;
a processor configured to address each of the plurality of memory cells, wherein, for each of the plurality of memory cells, the processor is configured to:
   apply a current to a channel layer of the memory cell;
   activate a gate of the memory cell by applying a voltage to the gate of the memory cell;
   upon activating the gate, channeling the current from the channel layer into a recording layer of the memory cell, wherein the recording layer is in a first resistance state; and
   transform at least one portion of the recording layer from the first resistance state to a second resistance state in order to write one or more bits into the recording layer, wherein the first resistance state and the second resistance state are different, and wherein at least one of a size or shape of the at least one transformed portion of the recording layer is controlled, in part, by the voltage applied to the gate and the current applied into the channel layer.

* * * * *